US012125667B2

United States Patent
Shirasaki et al.

(10) Patent No.: US 12,125,667 B2
(45) Date of Patent: Oct. 22, 2024

(54) CHARGED PARTICLE BEAM DEVICE

(71) Applicant: Hitachi High-Tech Corporation, Tokyo (JP)

(72) Inventors: Yasuhiro Shirasaki, Tokyo (JP); Makoto Sakakibara, Tokyo (JP); Momoyo Enyama, Tokyo (JP); Hajime Kawano, Tokyo (JP); Akira Ikegami, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 414 days.

(21) Appl. No.: 17/638,275

(22) PCT Filed: Sep. 20, 2019

(86) PCT No.: PCT/JP2019/037065
§ 371 (c)(1),
(2) Date: Feb. 25, 2022

(87) PCT Pub. No.: WO2021/053824
PCT Pub. Date: Mar. 25, 2021

(65) Prior Publication Data
US 2022/0328281 A1 Oct. 13, 2022

(51) Int. Cl.
*H01J 37/22* (2006.01)
*H01J 37/244* (2006.01)
*H01J 37/28* (2006.01)

(52) U.S. Cl.
CPC .......... *H01J 37/222* (2013.01); *H01J 37/244* (2013.01); *H01J 37/28* (2013.01); *H01J 2237/24514* (2013.01); *H01J 2237/2803* (2013.01)

(58) Field of Classification Search
CPC ........ H01J 37/222; H01J 37/244; H01J 37/28; H01J 37/256; H01J 2237/2803; H01J 2237/24514; H01J 2237/2611
See application file for complete search history.

(56) References Cited

U.S. PATENT DOCUMENTS

| 5,043,570 A | 8/1991 | Takabayashi |
| 6,734,428 B2 * | 5/2004 | Parker ..................... H01J 37/28 |
| | | 850/9 |

(Continued)

FOREIGN PATENT DOCUMENTS

| JP | 1991-044613 A | 2/1991 |
| JP | 2002310962 A | 10/2002 |

(Continued)

OTHER PUBLICATIONS

Office Action mailed Mar. 7, 2023 in Japanese Application No. 2021-546164.

(Continued)

*Primary Examiner* — Sean M Luck
(74) *Attorney, Agent, or Firm* — Miles & Stockbridge, P.C.

(57) ABSTRACT

A charged particle beam device includes a plurality of detectors configured to detect one or more signal charged particle beams caused by irradiation on a sample with one or more primary charged particle beams, and a control system. The control system is configured to measure an intensity distribution of the one or more signal charged particle beams detected by the plurality of detectors, and correct the intensity distribution by using a correction function. The control system is configured to generate an image based on the corrected intensity distribution.

10 Claims, 15 Drawing Sheets

(56) References Cited

U.S. PATENT DOCUMENTS

| | | | |
|---|---|---|---|
| 6,797,953 B2* | 9/2004 | Gerlach | B82Y 10/00 850/16 |
| 2002/0171051 A1 | 11/2002 | Nakagaki et al. | |
| 2006/0169899 A1* | 8/2006 | Parker | H01J 37/28 250/310 |
| 2007/0114449 A1 | 5/2007 | Nakayama | |
| 2011/0187847 A1 | 8/2011 | Bai et al. | |
| 2017/0243716 A1 | 8/2017 | Ogasawara | |

FOREIGN PATENT DOCUMENTS

| | | | |
|---|---|---|---|
| JP | 2007139575 A | 6/2007 |
| JP | 2010062106 A | 3/2010 |
| JP | 2011192498 A | 9/2011 |
| JP | 2017151155 A | 8/2017 |
| WO | 2015050157 A1 | 4/2015 |

OTHER PUBLICATIONS

Search Report mailed Dec. 24, 2019 in International Application No. PCT/JP2019/037065.
Written Opinion mailed Dec. 24, 2019 in International Application No. PCT/JP2019/037065.

* cited by examiner

[FIG. 1]
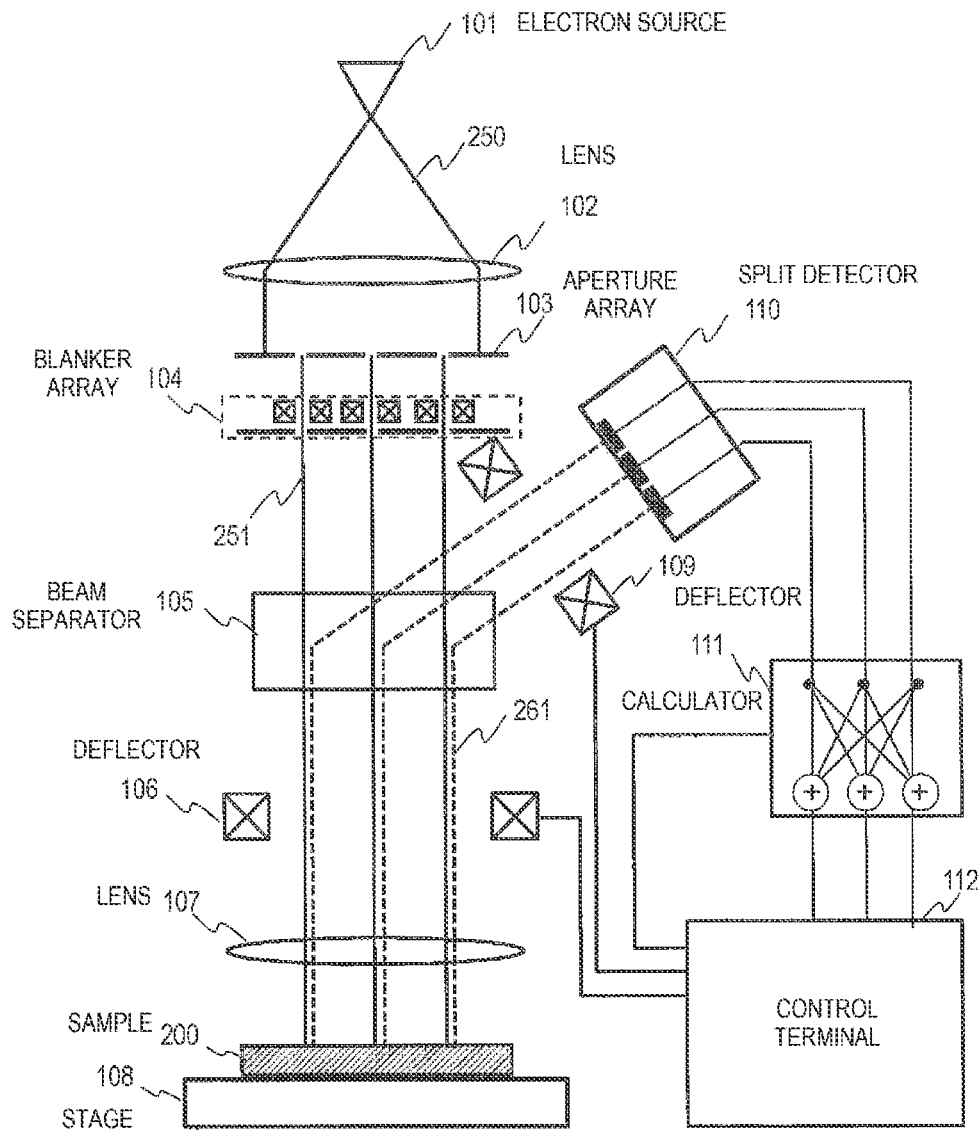
[FIG. 2]
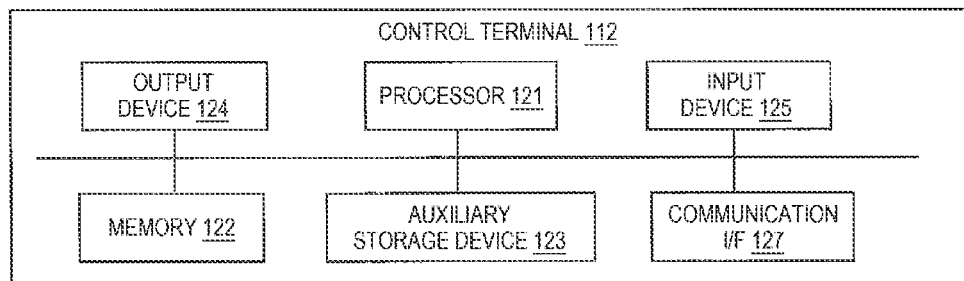

[FIG. 3]
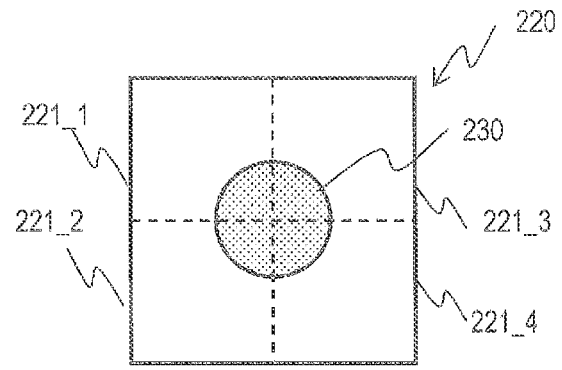
[FIG. 4A]
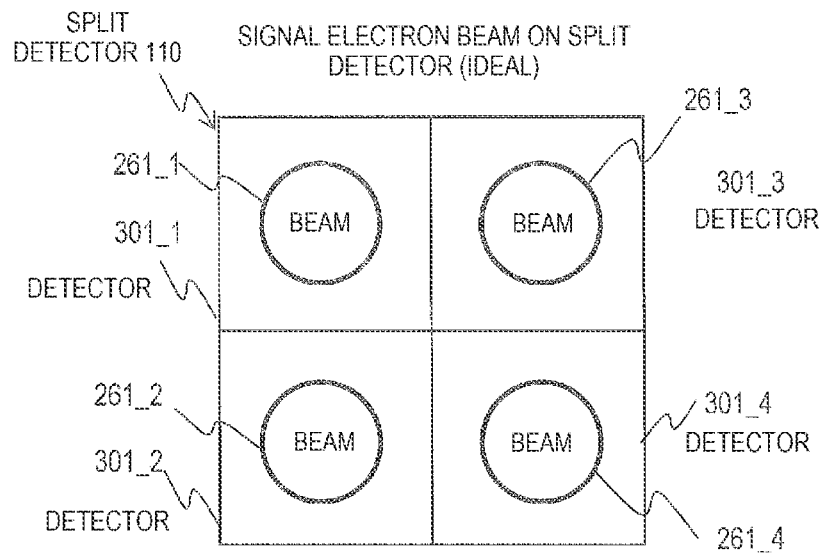
[FIG. 4B]
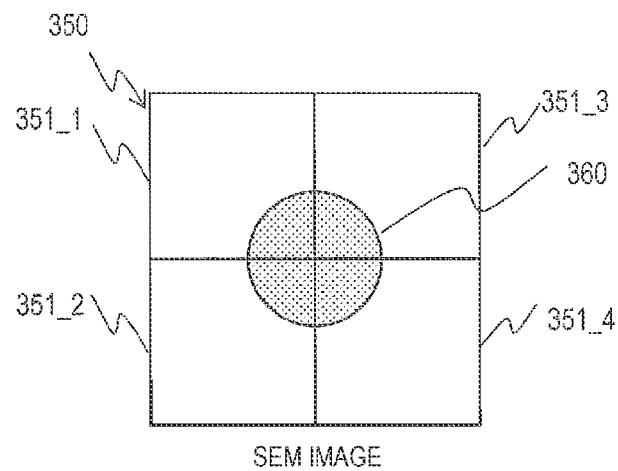

[FIG. 5A]
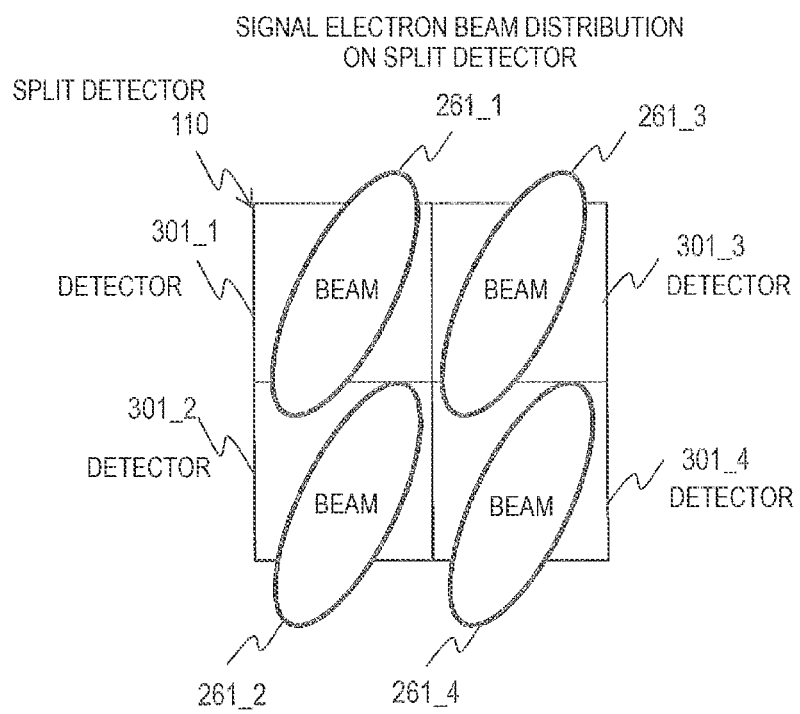
[FIG. 5B]
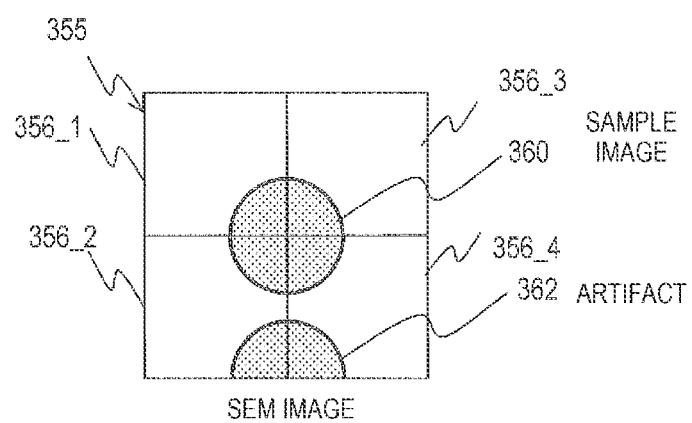

[FIG. 6]
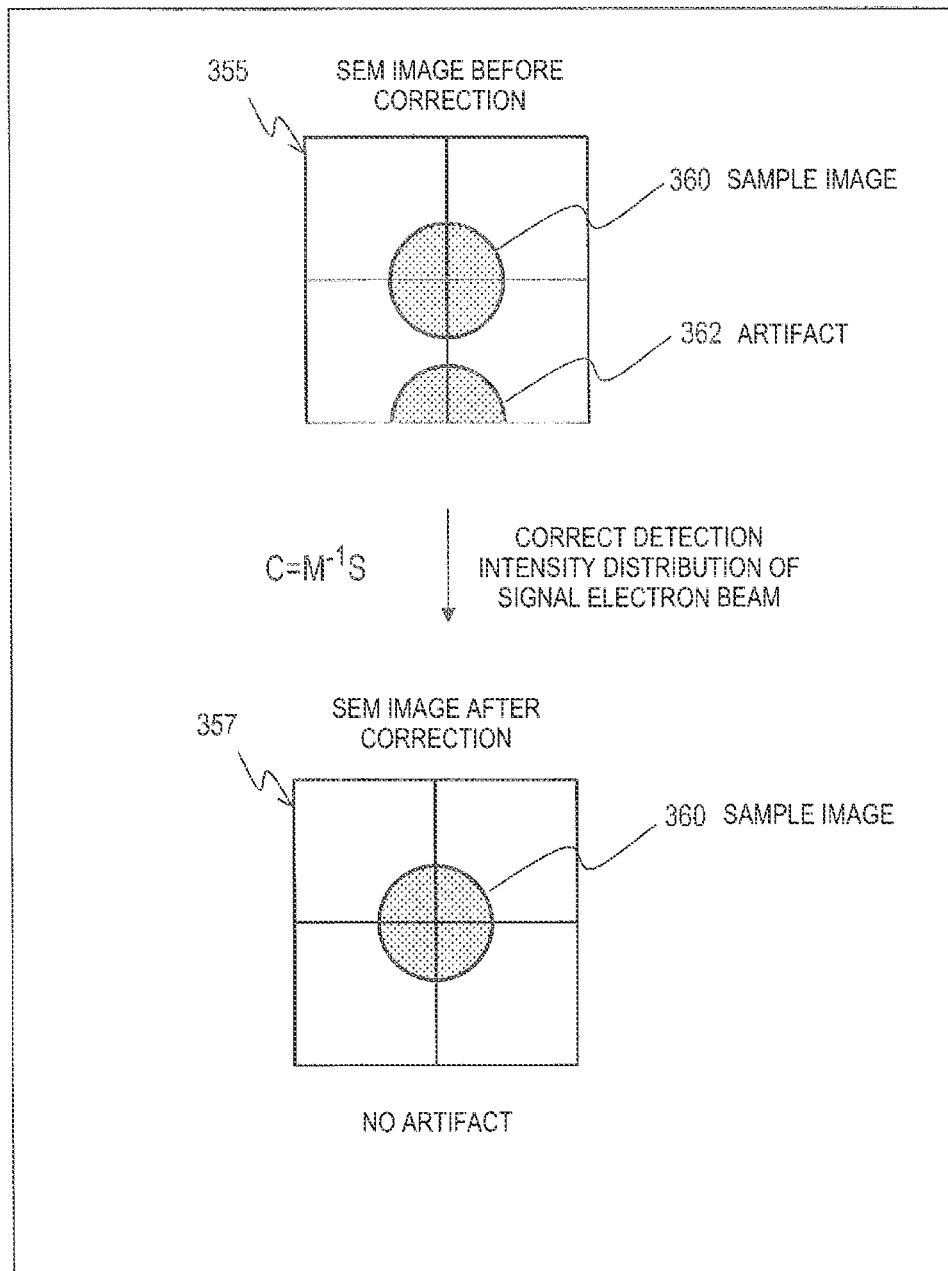

[FIG. 7A]
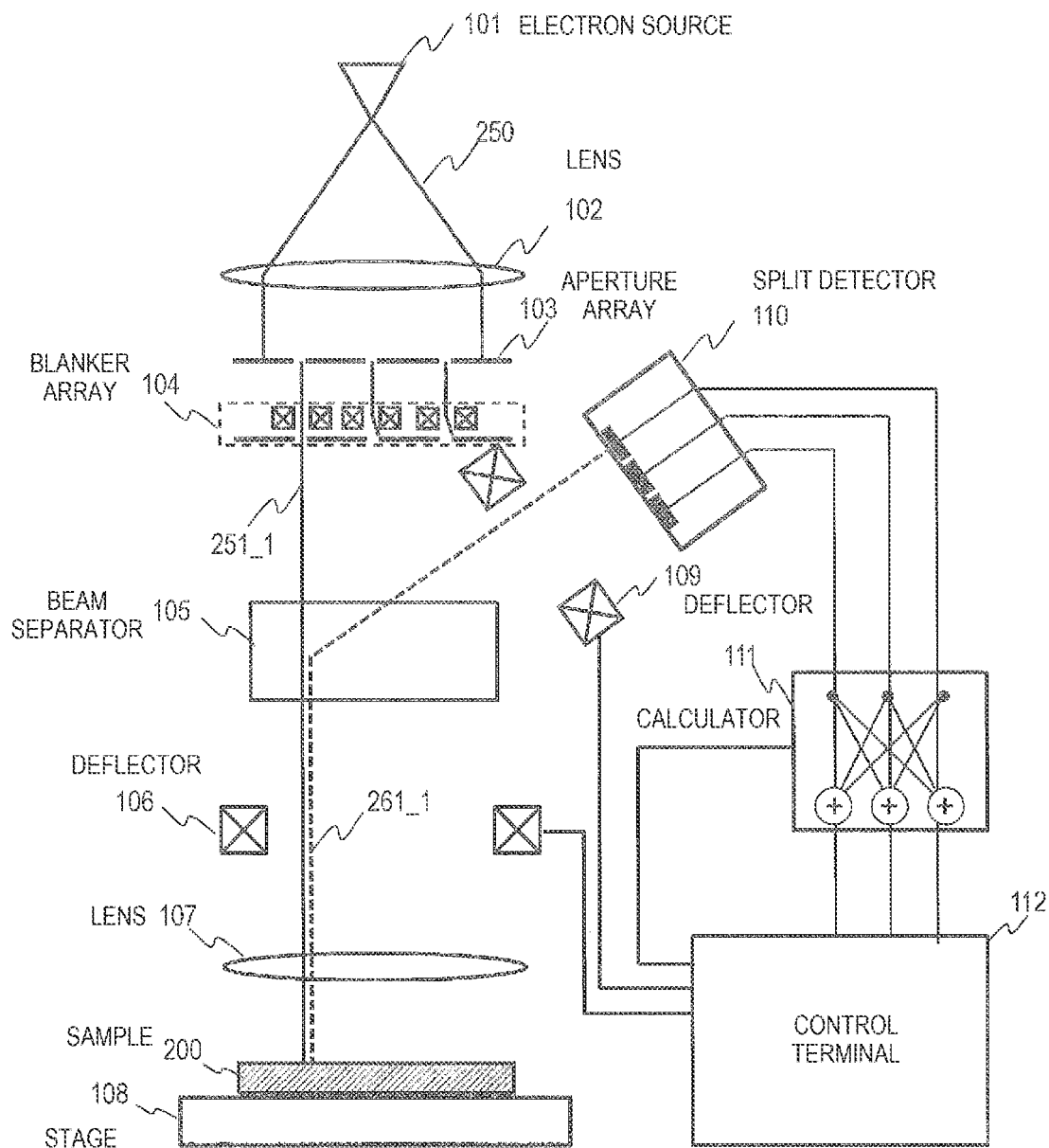

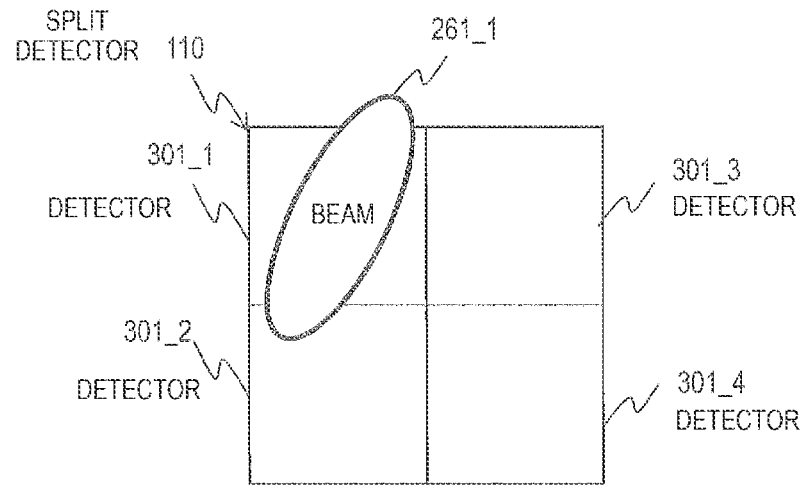

[FIG. 8A]
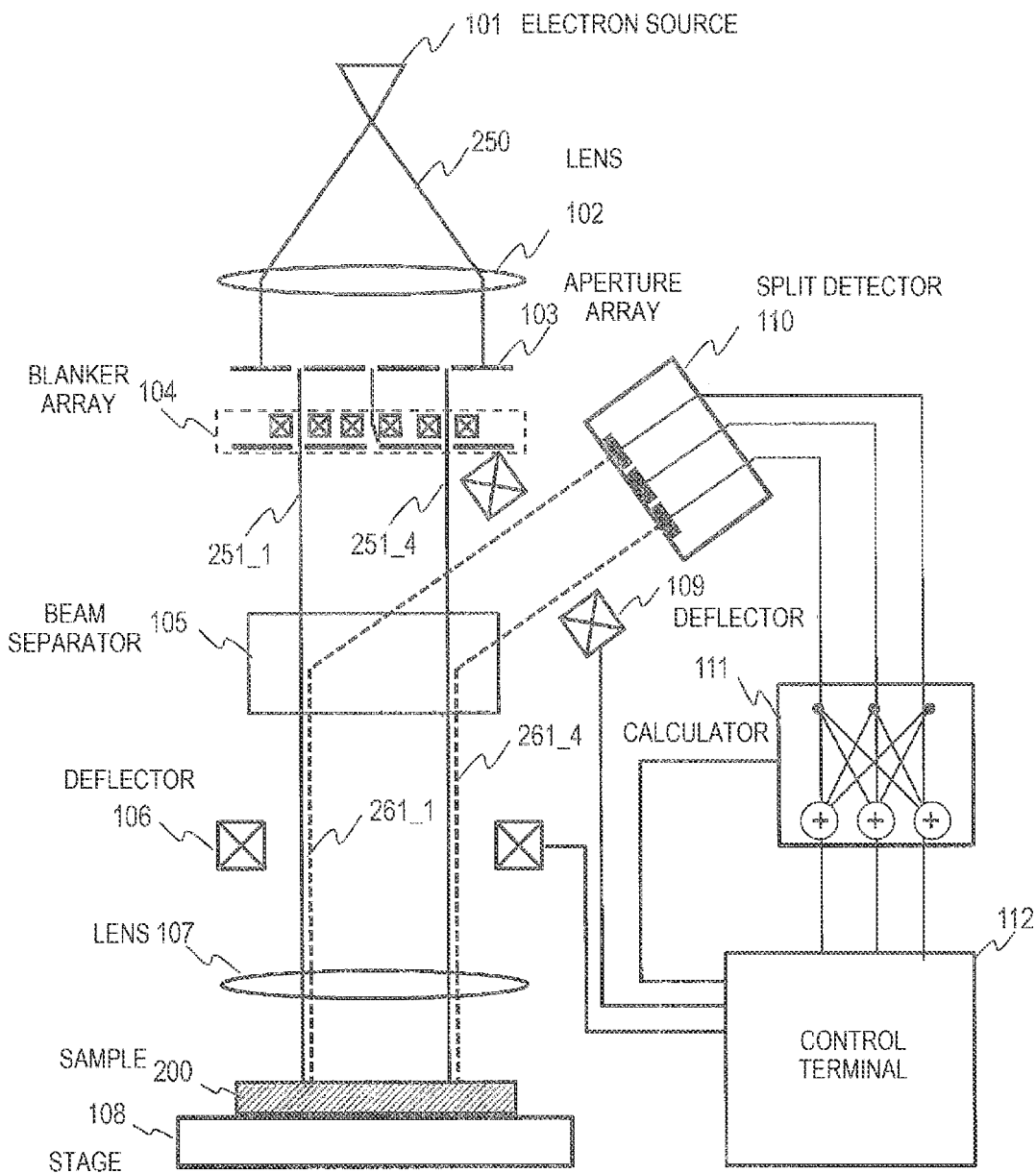

[FIG. 8B]
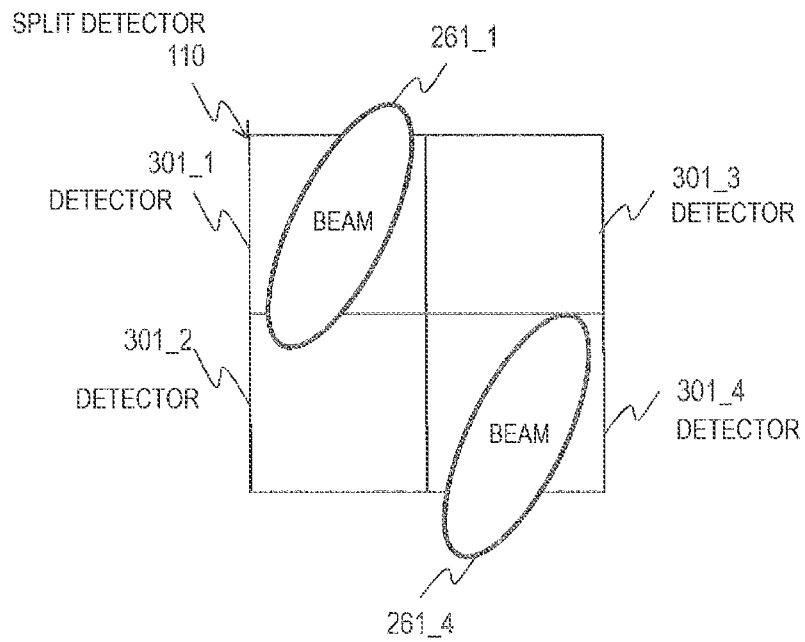
[FIG. 8C]

[FIG. 9]
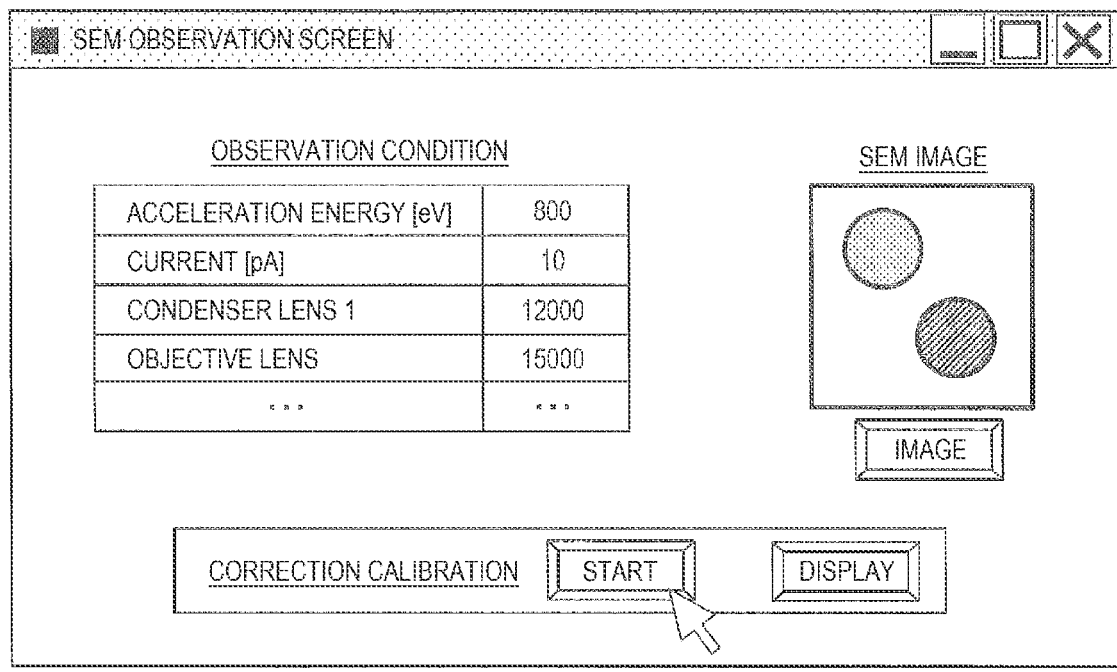

[FIG. 10]
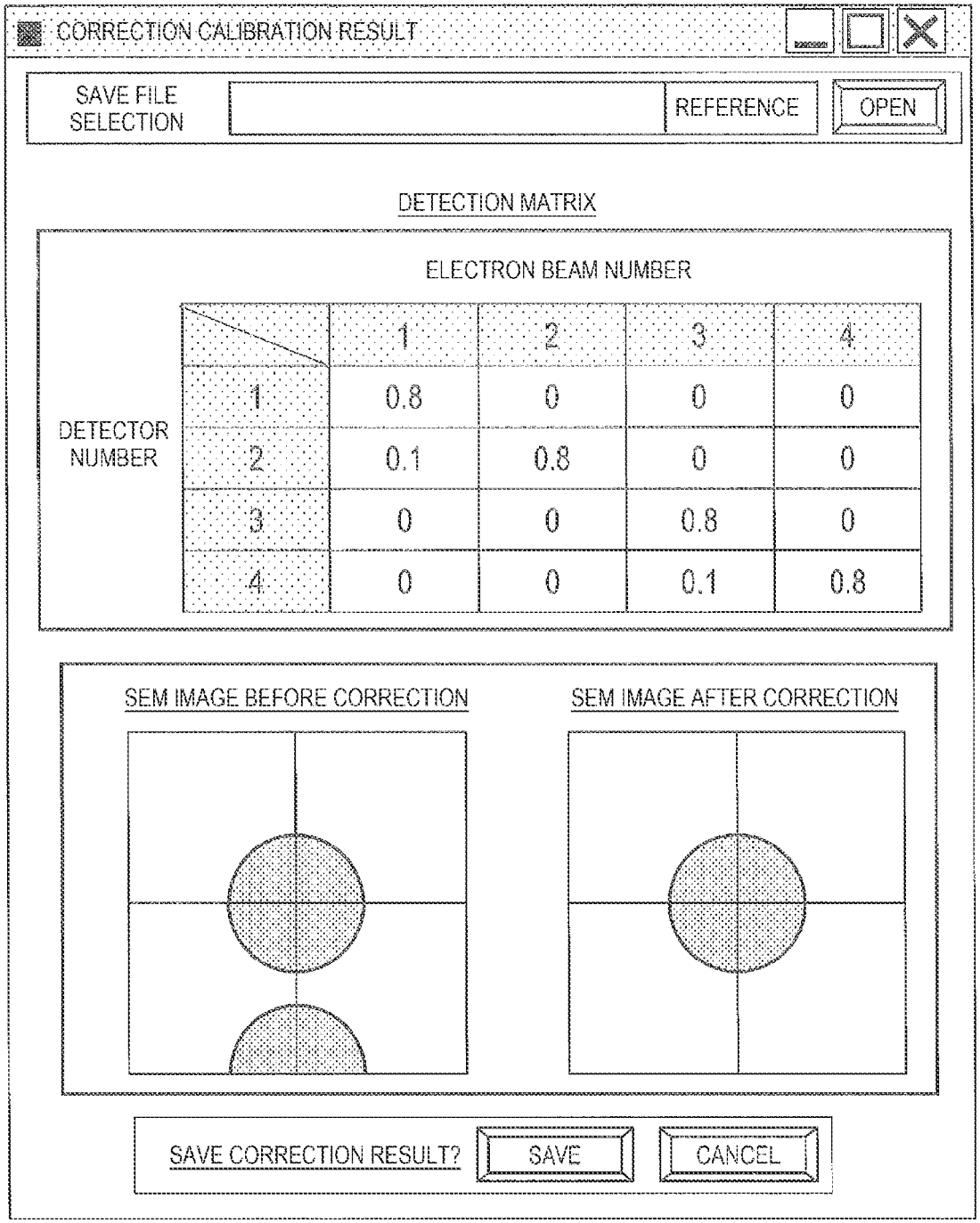

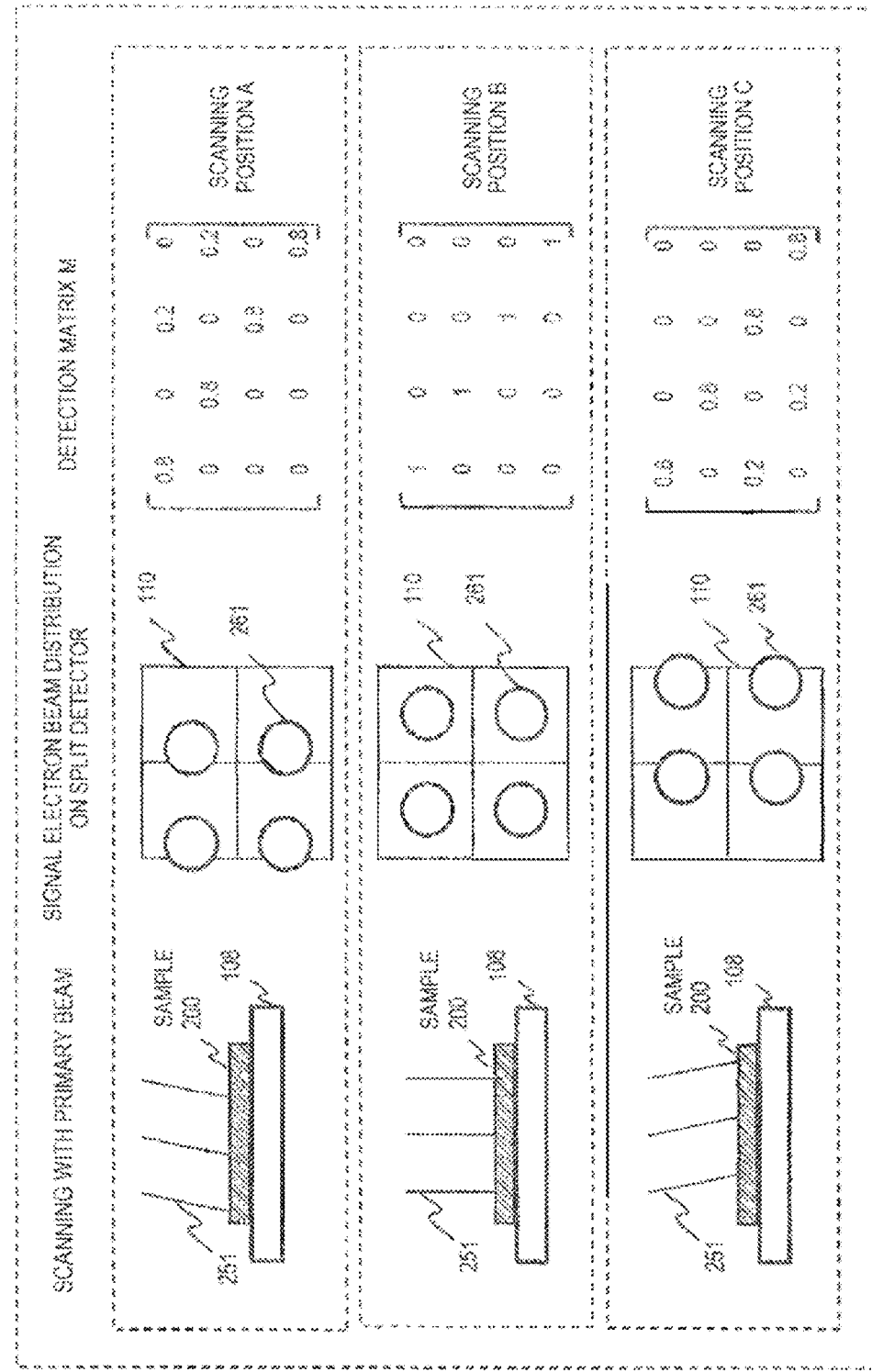
[FIG. 11]

[FIG. 12]
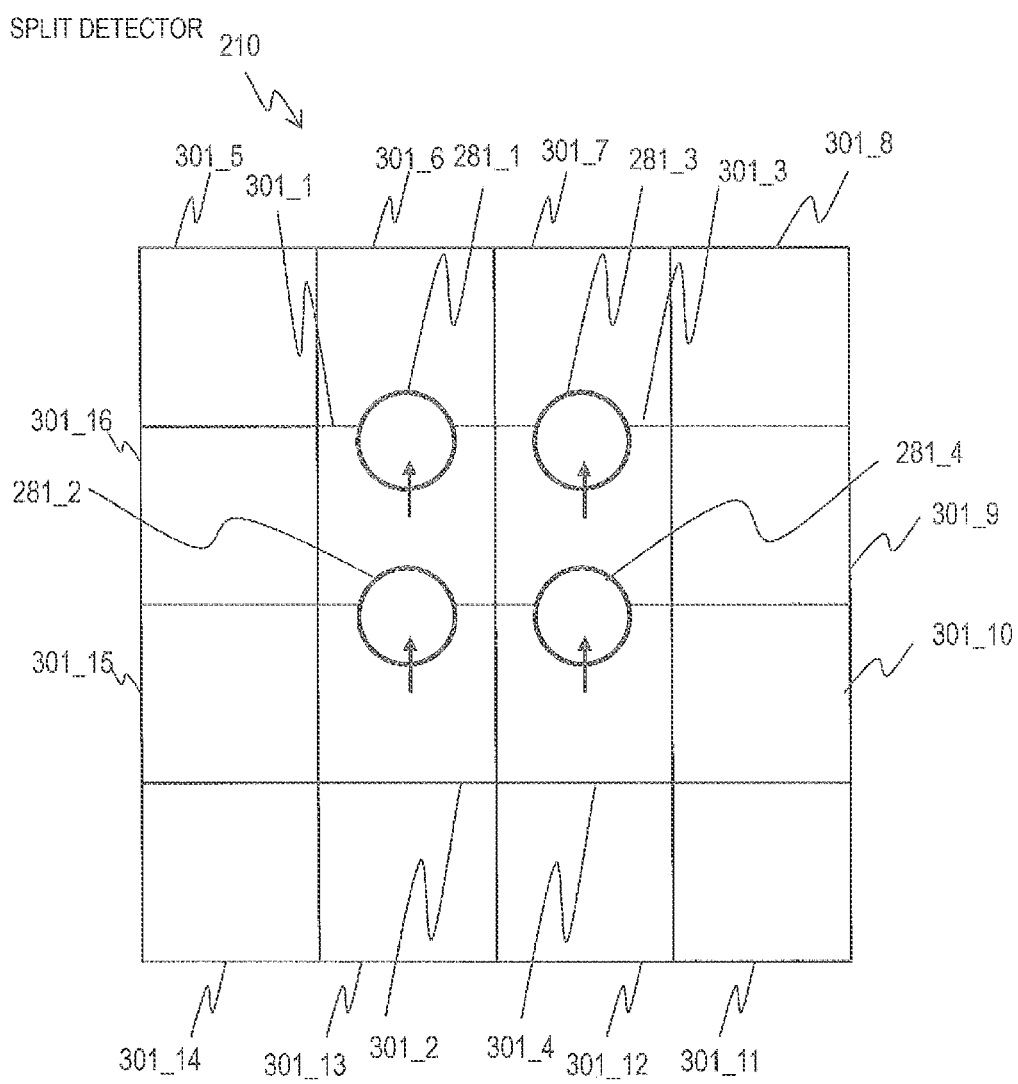

[FIG. 13A]
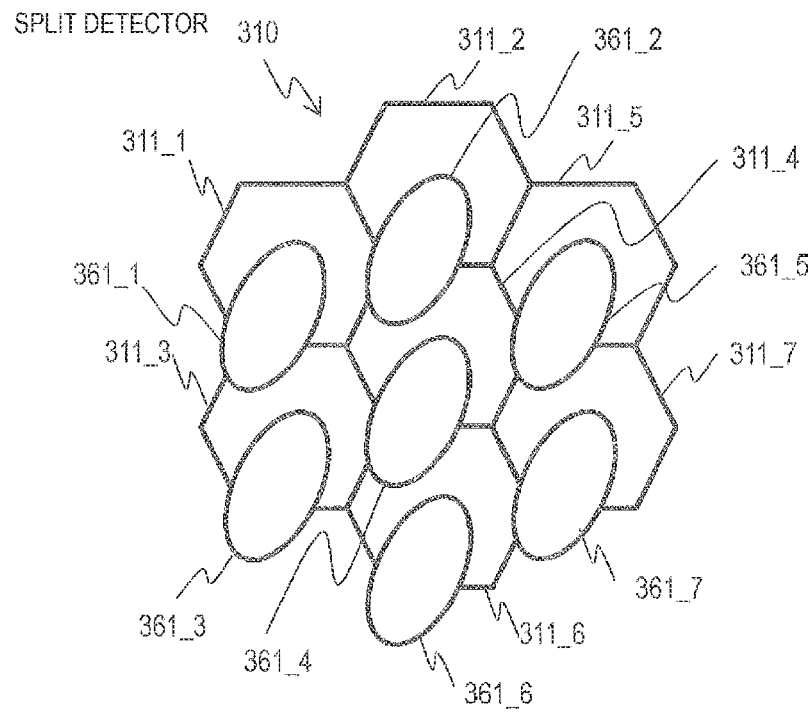
[FIG. 13B]

[FIG. 14A]
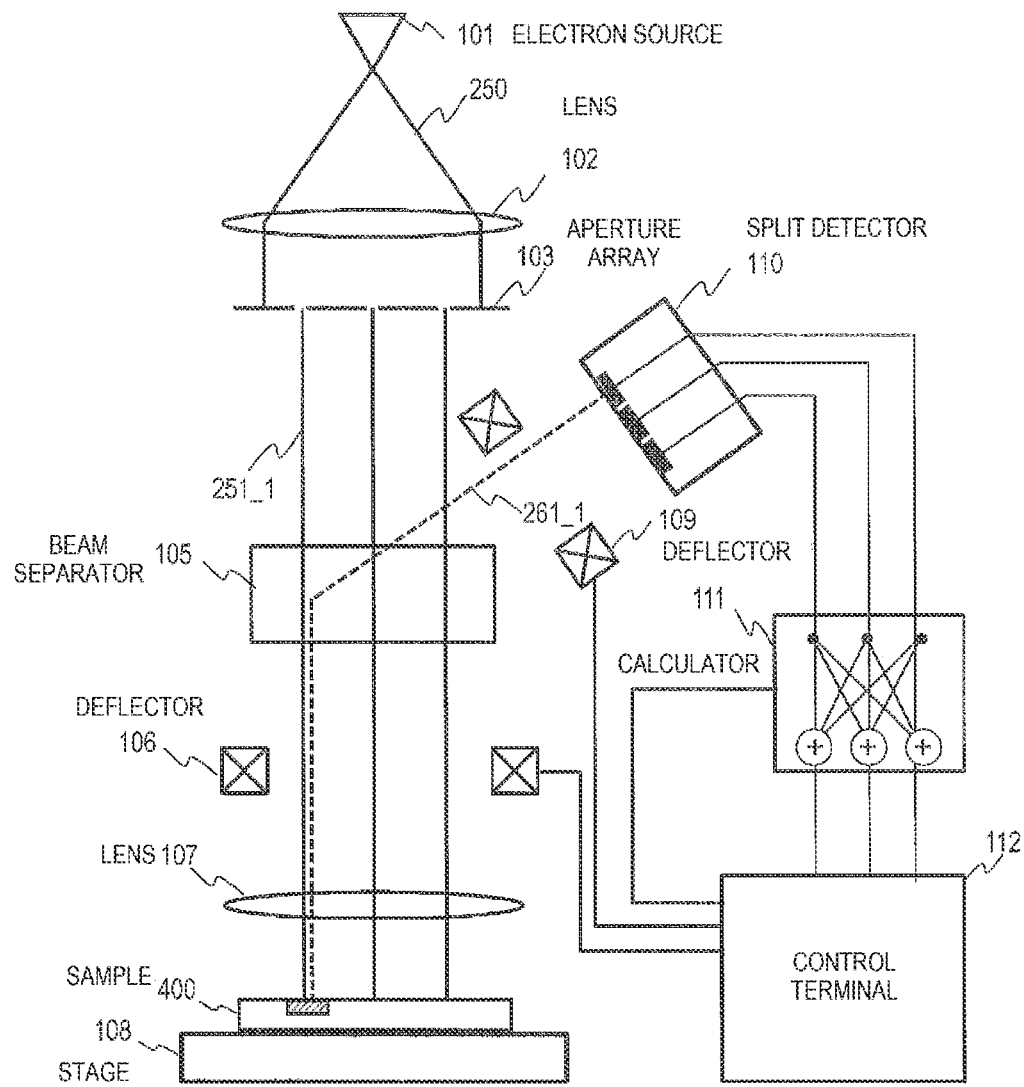
[FIG. 14B]
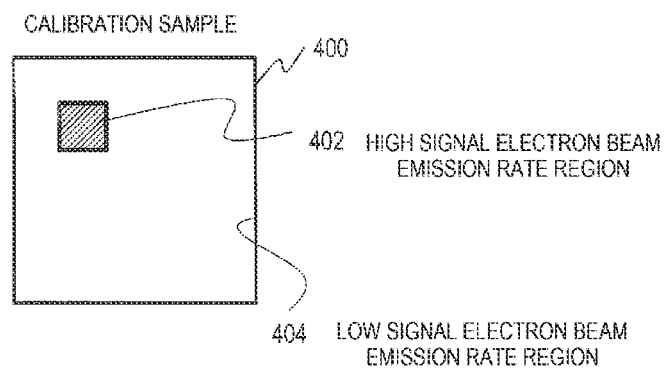

[FIG. 15]
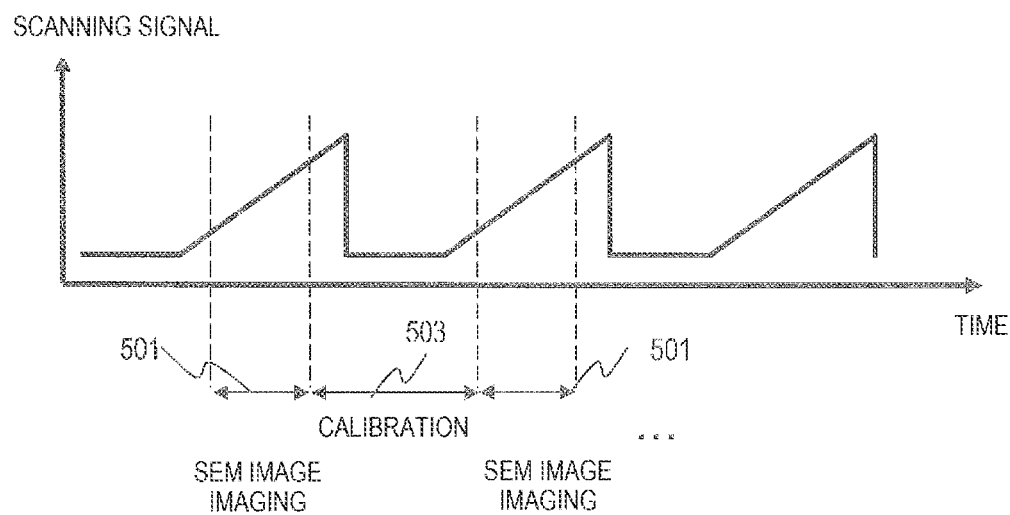

CHARGED PARTICLE BEAM DEVICE

TECHNICAL FIELD

The present disclosure relates to a charged particle beam device.

BACKGROUND ART

A charged particle beam device is used to observe fine structures. For example, in a semiconductor manufacturing process, a charged particle beam device using a charged particle beam such as an electron beam is used for measuring or inspecting a dimension and a shape of a semiconductor device. An example of the charged particle beam device is a scanning electron microscope (SEM). The SEM irradiates a sample to be observed with an electron beam (hereinafter, referred to as a primary beam) generated from an electron source, detects, with a detector, a signal electron generated by the irradiation, converts the signal electron into an electric signal, and generates an image.

Throughput is required for the SEM used for length measurement and inspection. Therefore, a multi-beam SEM has been proposed in which a sample is irradiated with a plurality of primary beams and a plurality of signal electron beams are simultaneously detected by a split detector including a plurality of detectors. Further, in order to improve a contrast of an SEM image, it has been proposed to discriminately detect signal electron beams of different information generated by one primary electron beam. For example, PTL 1 discloses a multi-beam type inspection device.

CITATION LIST

Patent Literature

PTL 1: JP-A-2017-151155

SUMMARY OF INVENTION

Technical Problem

A related multi-beam type SEM can form an accurate SEM image when a plurality of signal electron beams are detected by different detectors. However, when one signal electron beam spans a plurality of detectors, an artifact occurs in the SEM image.

Thus, in order to generate an accurate image based on the plurality of signal electron beams, it is required to accurately measure an intensity of each of a plurality of signal charged particle beams such that pieces of information on the plurality of signal charged particle beams are not mixed with each other. However, the signal charged particle beam may spread due to, for example, an influence of a lens or a scan deflector. Further, when a sample is charged, the signal charged particle beam shifts, making it difficult to accurately measure an intensity of each signal electron beam. The same problem may occur in detection of one signal electron beam spanning the plurality of detectors, and it is difficult to accurately measure an intensity of each part of one signal electron beam.

Solution to Problem

An example of a charged particle beam device according to the disclosure includes a plurality of detectors configured to detect one or more signal charged particle beams caused by irradiation on a sample with one or more primary charged particle beams, and a control system. The control system is configured to measure an intensity distribution of the one or more signal charged particle beams detected by the plurality of detectors, correct the intensity distribution by using a correction function, and generate an image based on the corrected intensity distribution.

Advantageous Effect

According one aspect of the disclosure, a more accurate image can be generated in a charged particle beam device that detects one or more signal charged particle beams by a plurality of detectors and generates an image.

BRIEF DESCRIPTION OF DRAWINGS

FIG. 1 illustrates a schematic configuration of a scanning electron microscope (SEM) according to a first embodiment.

FIG. 2 illustrates a hardware configuration example of a control terminal according to the first embodiment.

FIG. 3 illustrates as example of a sample installed on a stage according to the first embodiment.

FIG. 4A illustrates an example of ideal signal electron beam distributions on detection surfaces in a split detector according to the first embodiment.

FIG. 4B illustrates an SEM image generated based on the signal electron beam distributions illustrated in FIG. 4A.

FIG. 5A illustrates another example of the signal electron beam distributions on the detection surfaces in the split detector according to the first embodiment.

FIG. 5B illustrates an SEM image generated based on the signal electron beam distributions illustrated in FIG. 5A without correction.

FIG. 6 illustrates an example of an SEM image generated without correcting a detected intensity distribution of the signal electron beams and an example of an SEM image generated after correcting the detected intensity distribution of the signal electron beams according to the first embodiment.

FIG. 7A is a diagram illustrating a calibration example for determining a correction matrix $M^{-1}$ according to the first embodiment.

FIG. 7B is a diagram illustrating the above calibration example for determining the correction matrix.

FIG. 7C is a diagram illustrating the above calibration example for determining the correction matrix.

FIG. 8A is a diagram illustrating another calibration example for determining the correction matrix $M^{-1}$ according to the first embodiment.

FIG. 8B is a diagram illustrating the above another calibration example for determining the correction matrix $M^{-1}$.

FIG. 8C is a diagram illustrating the above another calibration example for determining the correction matrix $M^{-1}$.

FIG. 9 illustrates an example of a display screen of SEM observation conditions output by a control terminal.

FIG. 10 illustrates an example of a screen that displays a calibration result.

FIG. 11 schematically illustrates calibration according to a second embodiment.

FIG. 12 illustrates an example of detection surfaces (a plurality of detectors) in a split detector and signal electron beam distributions on the detection surfaces according to a third embodiment.

FIG. 13A schematically illustrates a plurality of detectors included in a split detector and signal electron beam distributions on the plurality of detectors according to a fourth embodiment.

FIG. 13B illustrates a detection matrix M corresponding to a state illustrated in FIG. 13A.

FIG. 14A illustrates an SEM that performs a calibration by using a sample according to a fifth embodiment.

FIG. 14B schematically illustrates a configuration of the sample according to the fifth embodiment.

FIG. 15 illustrates an example of a relation between an imaging period and a calibration period for an SEM image according to a sixth embodiment.

DESCRIPTION OF EMBODIMENTS

Hereinafter, embodiments will be described with reference to the drawings. In all the drawings for describing the embodiments, the same elements are denoted by the same reference numerals, and repetitive descriptions thereof are omitted. An example of a charged particle beam device specifically described below is a device (electron microscope) for observing a sample by using an electron beam as a primary charged particle beam and detecting a signal electron beam as a signal charged particle beam. A feature of the disclosure is also applicable to other charged particle beam devices, such as a device that uses an ion beam as the primary charged particle beam and/or detects the ion beam as the signal charged particle beam, a measurement device, or an inspection device.

First Embodiment

FIG. 1 is a diagram illustrating a schematic configuration of a scanning electron microscope (SEM), which is an example of a charged particle beam device. The SEM is a device for observing a sample by using an electron beam. First, a device configuration will be described. FIG. 1 illustrates a multi-beam type SEM that irradiates a sample with a plurality of primary beams (electron beams). The multi-beam type SEM can shorten an observation time and improve throughput by simultaneously observing a wide visual field with the plurality of primary beams.

The multi-beam type SEM illustrated in FIG. 1 includes an electron optical system and a control system that controls the electron optical system and generates an image based on the detected signal. In the configuration example in FIG. 1, the control system includes a calculator 111 and a control terminal 112. The control terminal 112 controls components (electron optical elements) of the electron optical system.

In the electron optical system, on an orbit of the primary beam drawn from an electron source 101 (charged particle source) toward a sample 200, a lens 102, an aperture array 103, a blanker array 104, a beam separator 105, scanning deflectors 106, and an objective lens 107 are arranged in this order.

The lens 102 makes the primary beams from the electron source 101 substantially parallel. The aperture array 103 is a plate having a plurality of apertures arranged in one or two dimensions, and splits a primary beam 250 from the lens 102 into a plurality of primary beams 251. The aperture array 103 is a splitter that splits the primary beam. In FIG. 1, as an example, one primary beam after splitting is indicated by reference numeral 251.

In the example described below, the aperture array 103 has four apertures, and the primary beam 250 from the electron source 101 is split into four primary beams 251.

Each of the primary beams 251 is a primary beam generated by the electron source 101 FIG. 1 illustrates three of the four primary beams 251. In the example described below, the number of the primary beams is four, but the number of the primary beams may be more than four or less than four. In the example described below, the plurality of primary beams 251 are generated by dividing the primary beam 250 generated by the single electron source 101, but a plurality of primary beams may be generated by using a plurality of electron sources.

The blanker array 104 selectively passes the plurality of primary beams 251 after splitting. The blanker array 104 includes deflectors corresponding to the plurality of primary beams 251 after splitting and an aperture array including apertures corresponding to the plurality of primary beams 251 after splitting. The control terminal 112 can select one or more primary beams 251 passing through the blanker array 104 by controlling the deflectors corresponding to the primary beams 251. A mechanism different from the blanker array can be used for selecting one or more primary beams 251.

In order to image the sample 200, all of the primary beams 251 pass through the blanker array 104. The primary beams 251 that have passed through the blanker array 104 pass through the inside of the beam separator 105. In this example, the beam separator 105 is set such that the primary beams 251 travel straight.

The primary beams 251 are emitted from the separator 105, pass through the scanning deflectors 106 and the objective lens 107, and then are focused on the sample 200. An exciting current of the scanning deflectors 106 is controlled by the control terminal 112 such that the primary beams 251 scan different regions on the sample 200.

For example, a negative voltage is applied to the sample 200, and the primary beams 251 are emitted to the sample 200 after being decelerated. The applied voltage is not limited and may be 0 kV. The primary beams 251 emitted to the sample 200 interact with a substance near a surface, and reflected electrons and other signal electrons are generated according to a shape and a material of the sample. In the present embodiment, electrons emitted from the sample 200 and detected by the split detector 110 are referred to as signal electrons.

The signal electrons generated from irradiation positions on the sample 200 by the primary beams 251 form signal electron beams 261. In FIG. 1, a plurality of signal electron beams are represented by broken lines, and as an example, one signal electron beam among the plurality of signal electron beams is indicated by reference numeral 261.

The sample 200 is arranged on a stage 108. The primary beams 251 emitted to the sample 200 interact with the substance near the surface of the sample 200 and generates the signal electron beams 261. The signal electron beams 261 return to the orbits of the primary beams 251. The signal electron beams 261 pass through the objective lens 107 and the scanning deflectors 106, and are then incident on the beam separator 105.

As optical elements acting on the signal electron beams 261, the beam separator 105 and reversing deflectors 109 for guiding the signal electron beams to the split detector 110 are arranged. The reversing deflectors 109 are arranged between the split detector 110 and the beam separator 105.

The beam separator 105 is set to deflect the signal electron beams 261 and separate the orbits of the signal electron beams 261 from the orbits of the primary beams 251. The signal electron beams 261 pass through the reversing deflectors 109 and reach the split detector 110. The split detector 110 includes a plurality of detectors. The number and layout of the detectors depend on a design of the device. For example, the detectors may be arranged in one row Cr in a plurality of rows. The number of the detectors is not less than the number of the signal electron beams.

In the following example, the split detector 110 includes four detectors. In an ideal state, the signal electron beams 261 reach the split detector 110 without mixing with each other and are detected independently by corresponding detectors.

The reversing deflectors 109 deflect the signal electron beams 261 from the beam separator 105. Positions where the signal electron beams 261 are generated on the sample 200 change in synchronization with a scan. The signal electron beams 261 are subjected to a deflection action of the scanning deflectors 106. The control terminal 112 controls the reversing deflectors 109 in synchronization with the scanning deflectors 106 such that each of the signal electron beams 261 generated by each of the primary beams 251 reaches a certain position of the split detector 110 regardless of scanning with the primary beam 251.

The split detector 110 detects an intensity distribution of. The plurality of signal electron beams 261 and converts the intensity distribution into a detected signal. The detected signal indicates a detected intensity acquired by each of the plurality of detectors included in The split detector 110. The intensity distribution changes according to the shape and the material of the sample 200 at the position where the primary beam 251 is emitted.

The calculator 111 performs a predetermined calculation on the detected signal indicating the signal intensity distribution acquired from the split detector 110. Details of a process by the calculator 111 will be described later. The control terminal 112 generates an SEM image based on a calculation result of the calculator 111 and displays the SEM image.

FIG. 1 schematically illustrates the configuration of the multi-beam type SEM, and the multi-beam type SEM may be added with other components, such as another lens, an aligner, a stigmator, which are not illustrated. The optical elements of the SEM (the lenses, the deflectors, the separator, the blanker array, and the like) generate an electric field, a magnetic field, or a composite of the magnetic field and the electric field and act on the electron beam.

All of the above optical elements are controlled by the control terminal 112. For example, the control terminal 112 controls a current amount and a voltage applied to each of the optical elements. A user can confirm and change the setting of each of the optical elements by using the control terminal 112. The control terminal 112 is, for example, a computer including an input/output device. The control terminal 112 may include a function of the calculator 111.

FIG. 2 illustrates a hardware configuration example of the control terminal 112. The control terminal 112 can have a computer configuration. The control terminal 112 includes a processor 121, a memory (main storage device) 122, an auxiliary storage device 123, an output device 124, an input device 125, and a communication interface (I/F) 127. The above components are connected to each other via a bus. The memory 122, the auxiliary storage device 123, or a combination thereof is a storage device and stores programs and data to be used by the processor 121.

The memory 122 is formed of, for example, a semiconductor memory, and is mainly used for storing a program and data being used in execution. The processor 121 executes various processes according to the programs stored in the memory 122. The processor 121 operates according to the programs, whereby various function units are implemented. The auxiliary storage device 123 is formed of a large-capacity storage device such as a hard disk drive or a solid state drive, and is used for storing the programs and data for a long period of time.

The processor 121 can be formed of a single processing unit or a plurality of processing units, and can include a single or a plurality of calculating units, or a plurality of processing cores. The processor 121 can be implemented as one or more central processing devices, a microprocessor, a microcomputer, a microcontroller, a digital signal processor, a state machine, a logic circuit, a graphics processing device, a chip-on system, and/or any device that operates a signal based on a control instruction.

The programs and data stored in the auxiliary storage device 123 are loaded into the memory 122 at startup or when needed, and the processor 121 executes the programs, whereby various processes of the control terminal 112 are executed. Therefore, the processes executed by the control terminal 112 in the following are processes performed by the processor 121 or the programs.

The input device 125 is a hardware device for the user to input instructions, information, or the like to the control terminal 112. The output device 124 is a hardware device that presents various images for input and output, and is, for example, a display device or a printing device. The communication I/F 127 is an interface for connecting to a network.

Functions of the control terminal 112 can be implemented into a computer system that includes one or more computers, and the one or more computers include one or more processors and one or more storage devices including a non-transitory storage medium. The one or more computers communicate with each other via the network. For example, some of the plurality of functions of the control terminal 112 may be implemented into one computer, and the other functions may be implemented into the other computers.

The detection of the intensity distribution of the signal electron beam by the split detector 110 and a correction of the intensity distribution by the control terminal 112 will be described below. FIG. 3 illustrates an example of a portion (structure portion) 230 of the sample 200 in a visual field 220. In the following description, the structure portion 230 is, for example, circular, flat, and is made of a uniform material. Therefore, it is assumed that the signal intensities are the same at any irradiation position. The visual field 220 includes four sections 221_1 to 221_4, which are scanned with different primary beams.

FIG. 4A illustrates an example of ideal signal electron beam distributions on detection surfaces in the split detector 110 FIG. 4B illustrates an SEM image 350 including an image 360 of the structure portion 230 acquired based on the signal electron beam distributions illustrated in FIG. 4A. As illustrated in FIG. 4A, the split detector 110 includes detection surfaces of four detectors 301_1 to 301_4. In the example in FIG. 4A, the detectors 301_1 to 301_4 are arranged in a two-dimensional matrix so as to form a quadrangle, and shapes are the same quadrangle. Four signal electron beams 261_1 to 261_4 are completely separated from each other and incident on and detected by the corresponding detectors 301_1 to 301_4, respectively.

Each of the signal electron beams 261_1 to 261_4 does not span the plurality of detectors, and all signal electrons of each of the signal electron beams are incident on only one detector. Specifically, the detectors 301_1 to 301_4 detect only (the intensities of) the signal electron beams 261_1 to 261_4, respectively, and detect all of the signal electrons of the corresponding signal electron beam.

As illustrated in FIG. 4B, the SEM image 350 generated by the control terminal 112 includes four sections 351_1 to 351_4 corresponding to the detectors 301_1 to 301_4, respectively. The sections 351_1 to 351_4 are generated based on the detected signals acquired by the detectors 301_1 to 301_4, respectively. The sections 351_1 to 351_4 are images of investigation ranges of the signal electron beams 261_1 to 261_4, respectively. The image 360 includes four parts included in the sections 351_1 to 351_4. An SEM image with a wide visual field can be acquired at once by using a plurality of primary beams.

FIG. 5A illustrates another example of the signal electron beam distributions on the detection surfaces in the split detector 110. FIG. 5A illustrates an example in which the signal electron beams incident on the split detector 110 are deformed. Due to an influence of the optical elements such as the lens and the deflector, a distribution shape of the signal electron beams may be deformed, and the signal electron beams may spread on the detection surface. As illustrated in FIG. 5A, one signal electron beam may span a plurality of detectors, and parts of the plurality of signal electron beams may be mixed on one detector. For example, the detector 301_2 detects not only the signal electron beam 261_2 but also the signal electron beam 261_1. In such a case, pieces of information on the plurality of signal electron beams are mixed with each other in the signal of one detector.

FIG. 5B illustrates an SEM image 355 generated without correction, based on signal electron beam intensity distributions corresponding to the signal electron beam distributions illustrated in FIG. 5A. The SEM image 355 includes an artifact 362 in addition to the image 360 of the structure portion 230. The detector 301_2 detects a part of the signal electron beam 261_1 and a part of the signal electron beam 261_2. Therefore, a section 356_2 corresponding to the detector 301_2 includes a part of the image 360 acquired based on the signal electron beam 261_2 and a part of the artifact 362 acquired based on the signal electron beam 261_1.

Further, the detector 301_4 detects a part of the signal electron beam 261_3 and a part of the signal electron beam 261_4. Therefore, a section 356_4 corresponding to the detector 301_4 includes a part of the image 360 acquired based on the signal electron beam 261_4 and a part of the artifact 362 acquired based on the signal electron beam 261_3.

In this manner, when the signal electron beam is deformed due to, for example, the deflector or the lens and is detected by the plurality of detectors, the artifact appears unless pieces of information on different signal electron beams are separated from each other. The charged particle beam device according to the present embodiment corrects the intensity distribution of the detected signal of the signal electron beam acquired by the split detector 110 and generates a more accurate SEM image. A method for correcting the intensity distribution of the signal electron beam and generating the SEM image will be described below.

FIG. 6 illustrates an example of the SEM image 355 generated without correcting the detected intensity distributions of the signal electron beams and an example of an SEM image 357 generated after correcting the detected intensity distributions of the signal electron beams. The detected intensity distribution indicates a distribution of signal intensities output by the number of a plurality of detectors when the split detector 110 detects one or more signal electron beams by the plurality of detectors. The calculator 111 according to the present embodiment corrects the intensity distributions formed by the signal intensities acquired by the plurality of detectors included in the split detector 110. The control terminal 112 acquires the corrected signal intensity distributions from the calculator 111, and generates the SEM image 357 based on the corrected signal intensity distributions.

As illustrated in FIG. 6, the correction of the signal intensity distribution is executed by using a product of a correction matrix $M^{-1}$ and the signal intensity distribution, and the correction matrix $M^{-1}$ represents a correction function. The correction function can perform a calculation different from a calculation by the correction matrix, and may be, for example, a model by machine learning. The correction matrix is an inverse matrix of a detection matrix M described later. The calculator 111 calculates a corrected intensity distribution C based on the correction matrix $M^{-1}$ based on a detected intensity distribution S detected by the split detector 110. The detected intensity distribution S and the corrected intensity distribution C can be represented by a vector (one of matrix) A configuration of the correction matrix M is determined based on a layout of the plurality of detectors in the split detector 110.

The calculator 111 corrects the detected intensity distribution S such that the corrected intensity distribution C approaches the detection distribution in the ideal state illustrated in FIG. 4A. The correction by the calculator 111 allows the control terminal 112 to generate a more accurate SEM image. In the examples in FIG. 6, the artifact 362 observed in the SEM image 355 before correction is not observed in the SEM image 357 after correction.

The calculator 111 is a programmable circuit such as a field-programmable gate array (FPGA), and can perform a high-speed calculation. The control terminal 112 sets the calculator 111 to execute a calculation (correction function) using the correction matrix $M^{-1}$. The function of the calculator 111 may be incorporated in the control terminal 112.

FIGS. 7A to 7C are diagrams illustrating a calibration example for generating the correction matrix $M^{-1}$. The sample 200 is flat as described above. The control terminal 112 sequentially selects one primary beam from the four primary beams. The control terminal 112 determines the detection matrix M based on the detected intensity distribution of the signal electron beam generated by the selected primary beam in the split detector 110.

As illustrated in FIG. 7A, the control terminal 112 controls the blanker array 104 to select one primary beam from the plurality of primary beams 251, that is, the primary beam 251_1 in FIG. 7A. The control terminal 112 acquires a detected intensity distribution of the signal electron beam 261_1 corresponding to the primary beam 251_1 from the split detector 110. The control terminal 112 acquires the detected intensity distribution directly from the split detector 110 or via the calculator 111 set in a non-correction calculation manner.

FIG. 7B illustrates an example of the distribution of the signal electron beam 261_1 on the detection surfaces is the split detector 110. The signal electron beam 261_1 is incident on the (detection surfaces) of the detector 301_1 and the detector 301_2. The detectors 301_1 and 301_2 detect different parts of the signal electron beam 261_1. The other detectors 301_3 and 301_4 have not detected the signal electron beam 261_1, and detected intensities are 0.

As illustrated in FIG. 7C, the control terminal 112 determines elements of a column 265_1 corresponding to the signal electron beam 261_1 in the detection matrix M based on the detected intensities (measured values) acquired by the detectors 301_1 to 301_4. The product of an actual signal electron beam intensity distribution B and the detection matrix M is equal to the detected intensity distribution S. In the intensity distribution B, B1 to B4 correspond to the intensities of the signal electron beams 261_1 to 261_4, respectively. In the detected intensity distribution S, S1 to S4 correspond to the detected intensities acquired by the detectors 301_1 to 301_4, respectively.

In the example in FIG. 7C, the control terminal 112 determines a ratio of the detected intensities acquired by the detectors 301_1 to 301_4 as the elements of the column. When the intensity of each signal electron beam is known, normalization may be performed such that a sum, of each column of the matrix is proportional to the intensity of the signal electron beam corresponding to that column. When assuming that the intensities of the four signal electron beams are the same, the ratio of the detected intensity, of each signal electron beam acquired by each of the detectors may be determined by setting the maximum detected intensity of the signal electron beam to 1.

The control terminal 112 measures each of all of the primary beams as described above, and determines the elements of each column of the detection matrix M. Based on the detection matrix N calculated by the above method, the control terminal 112 calculates the correction matrix $M^{-1}$, which is the inverse matrix of the detection matrix M. Accordingly, the correction matrix $M^{-1}$ (correction function) is generated. The control terminal 112 sets the calculator 111 such that the calculator calculates the detected signal based on the equation in FIG. 6. Accordingly, the calculator 111 is set to output the actual signal electron beam intensity distribution B. The control terminal 112 can generate a more accurate SEM image by imaging the actual signal electron beam intensity distribution B.

In an observation of a target sample, the control terminal 112 acquires the corrected signal electron beam intensity distribution C based on the product of the detected intensity distribution S and the correction matrix $M^{-1}$ by the calculator 111. The control terminal 112 generates the SEM image based on the intensity distribution C. The corrected signal electron beam intensity distribution C is an actual signal electron beam intensity distribution calculated based on the detected intensity distribution and the corrected signal electron beam intensity distribution C is a value close to the signal electron beam intensity distribution B. By correction with the correction matrix $M^{-1}$, a more accurate and high-duality SEM image can be generated.

A change from the ideal state of the signal electron beam caused by the SEM optical system is generally less dependent on the type of the sample and the irradiation position on the sample. Therefore, the sample used for the calibration may be a type of sample same as or different from the sample to be actually observed. Further, the shape of the signal electron beam at a specific irradiation position is measured without scanning with the primary beam, the correction matrix is determined and commonly applied to all pixels (the entire scanned range) in the SEM image, thereby enabling an efficient calibration.

FIGS. 8A to 8C are diagrams illustrating another calibration example for determining the correction matrix $M^{-1}$. In the following, differences from the calibration example described with reference to FIGS. 7A to 7C will be mainly described. In this example, the sample is simultaneously irradiated with a plurality of selected primary beams, and detection matrix elements for the signal electron beams caused by the plurality of primary beams are determined simultaneously. This makes it possible to shorten a calibration time.

In the example illustrated in FIG. 8A, the control terminal 112 controls the blanker array 104 to select two primary beams from the four primary beams, that is, the primary beams 251-1 and 251_4 FIG. 8A. The control terminal 112 acquires, from the split detector 110, the detected intensity distributions of the signal electron beans 261_1 and 261_4 corresponding to the primary beams 251_1 and 251_4, respectively.

FIG. 8B illustrates an example of the distributions of the signal electron beams 261_1 and 261_4 on the detection surfaces in the split detector 110. The signal electron beam 261_1 is incident on (the detection surfaces of) the detector 301_1 and the detector 301_2. The signal electron beam 261_4 is incident on (the detection surface of) the detector 301_4.

The detectors 301_1 and 301_2 detect different parts of the signal electron beam 2611. The other detectors 301_3 and 301_4 have not detected the signal electron beam 261_1, and detected intensities are 0. The detector 301_4 detects a part of the signal electron beam 261_4. The other detectors 301_1 to 301_3 have not detected the signal electron beam 261_4, and detected intensities are 0.

As illustrated in FIG. 8B, the signal electron beams 261_1 and 261_4 are detected by different detectors, and the signal electron beams 261_1 and 261_4 are not detected by a common detector. Thus, the signal electron beams detected by one or more different detectors can be measured simultaneously for the generation of the correction matrix. As illustrated in FIG. 8C, the control terminal 112 determines elements of the column 265_1 and a column 265_4 corresponding to the signal electron beam 261_1 and the signal electron beam 261_4, respectively, in the detection matrix M based on the detected intensity distributions of the detectors 301_1 to 301_4.

The above signal electron beam intensity distribution correction can be applied to a charged particle beam device different from the multi-beam type SEM. For example, in order to improve a contrast of the SEM image, the above signal electron beam intensity distribution correction can be applied to an SEM that irradiates a sample with one primary beam and detects one signal electron beam that spans a plurality of detectors.

The SEM discriminates an emission angle signal of the signal electron beam by detecting the signal electron beam generated from the sample with different detectors according to an emission angle of the sample, for example. A spatial distribution of the signal electron beam depends on the energy and the angle distribution of the signal electrons emitted from the sample 200.

The split detector 110 detects these signal electron beams by using the plurality of detectors. The contrast caused by the emission angle of the signal electrons emitted from the sample can be proved by discriminating the signal of the signal electron beam. In another example, the signal can be discriminated according to the emission energy of the signal electrons by including an optical element such as a Wien filter in the optical system of signal electrons. The control terminal 112 may correct an observed image of a target sample by using a correction matrix prepared in advance without making a self-correction.

FIG. 9 illustrates an example of a display screen of SEM observation conditions output by the control terminal 112. On an SEM observation screen, the user can set observation conditions such as an acceleration voltage of the electron beam, the current amount, and an excitation intensity of the lens. When the user presses an imaging button after setting the observation conditions, the SEM image is imaged and displayed on the SEM observation screen. When the correction matrix needs to be adjusted, the user presses a correction calibration button, so that the control terminal starts calibrating the correction matrix. The correction matrix acquired by the calibration can be displayed by pressing a display button.

FIG. 10 illustrates an example of a screen displaying a calibration result. The detected intensity distribution of each of the signal electron beams is displayed in a detection matrix frame. The SEM images before and after the correction can be confirmed on the same screen when the displayed detection matrix is used. The detection matrix acquired by the calibration can be saved with a save button. The saved correction matrix can be selected and used in a save file selection frame.

According to the present embodiment, an SEM image in which the artifact is prevented can be imaged by correcting the detected signal.

Second Embodiment

A second embodiment will be described below. The correction matrix in the first embodiment is effective when the detected intensity distribution of each of the signal electron beams does not depend on the deflectors. However, when the reversing deflectors are not adjusted sufficiently, or when it is difficult to accurately fix the irradiation position of the signal electron beam on the split detector for all of the signal electron beams, the detected intensity distribution of the signal electron beam will fluctuate in conjunction with the deflectors. That is, the correction matrix is required for each irradiation position of the primary beam on the sample.

FIG. 11 schematically illustrates a calibration according to the second embodiment. The control terminal 112 according to the second embodiment creates correction matrices corresponding to different scanning positons of the primary beams. The signal electron beam is deflected by the deflectors in conjunction with scanning with the primary beam. Therefore, a change from an ideal state of the signal electron beam on the detection surface in the split detector 110 may depend on the scanning positon. By measuring scanning position dependence of a detected intensity distribution of the signal electron beam in advance, the detected signal can be corrected for the detected intensity distribution according to the primary beam irradiation position, and a more accurate SEM image can be acquired.

In the following, differences from the first embodiment will be mainly described FIG. 11 illustrates, as an example, primary beams at three scanning positions A, B, and C, signal electron beam distributions in the split detector 110, and detection matrices. In FIG. 11, one of the plurality of primary beams is designated by reference numeral 251 as an example, and one of the plurality of signal electron beams is designated by reference numeral 261 as an example. A method for determining the detection matrix at each primary beam irradiation position may be the same as in the first embodiment in the example in FIG. 11, the sample 200 is flat and the intensity of the signal electron beam is known in advance or by measurement.

In one example, a correction matrix is prepared for each pixel of the SEM image. Accordingly, a more accurate SEM image can be generated. The control terminal 112 can generate the correction matrix corresponding to each pixel by applying the calibration described in the first embodiment. The pixel and the irradiation position of the primary beam are associated with each other in advance. The control terminal 112 changes a setting of the calculator 111 in conjunction with the scanning based on the correction matrix corresponding to each pixel.

The number of correction matrices to be prepared is designed according to the accuracy of an image at the time of imaging, and one correction matrix may be prepared for a plurality of pixels. Alternatively, the correction matrix may be prepared for each of the plurality of pixels correction process using the correction matrix may be performed collectively after imaging the SEM image, not in real time.

According to the present embodiment, an SEM image in which an artifact is prevented can be imaged by correcting the detected signal for each pixel of the image.

Third Embodiment

A third embodiment will be described below Differences from the first embodiment will be mainly described. The control terminal 112 according to the third embodiment corrects a change in signal electron beam during observation of a sample. Correction methods according to the previous embodiments are based on a premise that the detection matrix does not change during observation. However, when a sample is charged during observation, an electron field is generated near the sample, and the signal electron beam is subjected to a lens action or a deflection action. Further, since the energy of the signal electron beam changes, a deflection sensitivity of the signal electron beam when passing through optical elements such as deflectors also changes. As a result, a detected intensity distribution of the signal electron beam changes, and a correction matrix acquired in advance by a calibration is not effective. The control terminal 112 can correct such an influence of the charging of the sample on the signal electron beam.

FIG. 12 illustrates an example of detection surfaces (of a plurality of detectors) in a split detector 210 and signal electron beam distributions on the detection surfaces according to the third embodiment. In the configuration example illustrated in FIG. 12, the split detector 210 includes 16 detectors 301_1 to 301_16.

Similar to the first embodiment, the split detector 210 detects four signal electron beams 281_1 to 281_4. In an ideal state, the four signal electron beams 281_1 to 281_4 are detected by the detectors 301_1 to 301_4, respectively, and each of the signal electron beams is detected by only one detector.

As described above, when the sample is charged during the observation of the sample (during generation of an SEM image of the sample), the detected intensity distributions of the signal electron beams 281_1 to 281_4 acquired by the split detector 210 change. In the example in FIG. 12, the signal electron beams 281_1 to 281_4 move on the detection surfaces in the split detector 210. Arrows indicate the movements of the signal electron beams from ideal positions.

As described above, the influence of the charging of the sample may be generated due to a change of a deflection sensitivity due to an energy change of the signal electron beam, and a detected position of the signal electron beam is moved on the detection surface in the split detector 210. Movement modes or all of the signal electron beams may be the same as or different from each other. In the present embodiment, the movement (movement direction and movement amount) of the signal electron beam is detected, and the detected intensity distribution of the signal electron beam is corrected based on the detected movement.

As illustrated in FIG. 12, the split detector 210 includes detectors having a number more than the number or signal electron beams to be detected. Specifically, the split detector 210 includes the detectors 301_5 to 301_16 arranged around the four detectors 301_1 to 301_4, in addition to the four detectors 301_1 to 301_4 at a center. In the ideal state, all of the signal electron beams 281 to 281_4 are detected by the detectors 301_1 to 301_4. By referring to detection values of the surrounding detectors 301_5 to 301_16, the movements of the signal electron beams 281_1 to 281_4 can be detected, and real-time corrections corresponding to the movements can be made.

The control terminal 112 monitors the detected intensity distributions of the signal electron beams 281_1 to 281_4, and determines the correction matrices of the signal intensity distributions based on statistical values of the detected intensity distributions. For example, the control terminal 112 calculates centroid positions of the detected intensity distributions of the signal electron beams 281_1 to 281_4, and determines the correction matrix according to a predetermined calculation expression based on the centroid positions. Accordingly, when all of the signal electron beams move, an appropriate real-time correction can be made.

In another example, the control terminal 112 may determine the correction matrix according to the predetermined calculation expression based on variances of the detected signal intensity distributions in place of or in addition to the centroid positions. Accordingly, when the signal electron beams move in different directions, an appropriate real-time correction can be made.

The control terminal 112 may correct the movements of the signal electron beams when predetermined conditions are satisfied. The conditions for making the correction by using the correction matrix may include, for example, that all signal electron beams have been detected and that at least one of the surrounding detectors 301_5 to 301_16 has detected the signal electron beams.

The control terminal 112 can make the correction according to the present embodiment without correcting the detected intensity distribution change caused by the optical system described in the first or second embodiment. Alternatively, the control terminal 112 can correct the changes in the detected intensity distributions described in the first or second embodiment, and can also make the correction according to the present embodiment.

According to the present embodiment, by correcting the detected signals, it is possible to image an SEM image, in which an artifact caused by unexpected changes in the detected signal distributions due to the charging of the sample and the like are prevented.

Fourth Embodiment

A fourth embodiment will be described below. Differences from the first embodiment will be mainly described FIG. 13A schematically illustrates a plurality of detectors included in a split detector and signal electron beam distributions on the plurality of detectors according to the fourth embodiment. A split detector 310 includes seven hexagonal detectors 311_1 to 311_7. The detectors 311_1 to 311_7 are arranged without a gap. The number of detectors varies according to a design. In an ideal state, the detectors 311_1 to 311_7 detect signal electron beams 361_1 to 361_7, respectively. The signal electron beams 361_1 to 361_7 are each detected by a different detector.

FIG. 13B illustrates the detection matrix M corresponding to the state illustrated in FIG. 13A. The product of the actual signal electron beam intensity distribution B and the detection matrix M is equal to the detected signal electron beam intensity distribution S. In the intensity distribution B, B1 to B7 correspond to intensities of the signal electron beams 361_1 to 361_7, respectively. In the intensity distribution S, S1 to S7 correspond to detected intensities acquired by the detectors 311_1 to 311_7, respectively. The detected intensity distribution S can be corrected in the same manner as in the first embodiment.

As described above, detected signals acquired by the split detector 310 including the detectors having various shapes and arrangements can be appropriately corrected.

Fifth Embodiment

A fifth embodiment will be described below Differences from the embodiment will be mainly described. In the present embodiment, a signal electron beam is selectively generated by using a sample for calibration FIG. 14A illustrates an SEM that performs the calibration by using a sample 400 according to the fifth embodiment. In comparison with the configuration illustrated in FIG. 1, the blanker array is omitted. With the sample 400, the blanker array which is complicated to configure and control can be omitted.

FIG. 14B schematically illustrates a configuration of the sample 400. The sample 400 includes a high signal electron beam emission rate region 402 and a low signal electron beam emission rate region 404. The high signal electron beam emission rate region 402 is local, and is irradiated with only one of all of the primary beams.

In the example in FIG. 14A, only the primary beam 251_1 is emitted to the region 402, and all of the other primary beams are emitted to the low signal electron beam emission rate region 404. The sample 400 emits only the signal electron beam 261_1 caused by the emitted primary beam 251_1 in the high signal electron beam emission rate region 402.

As described above, by using sample including a local region having a high signal electron beam emission rate, the signal electron beam for the calibration can be selected without using the blanker array. For example, for the primary beams 251_1 to 251_4, calibration samples in which positions of the high signal electron beam emission rate regions are different are prepared. Accordingly, the signal electron beams caused by the primary beams can be measured individually. As described with reference to FIGS. 8A to 8C, a sample including a plurality of high emission rate regions is used for simultaneously measuring a plurality of signal electron beams.

According to the present embodiment, a detected signal distribution can be calibrated without using a complicated blanker array.

Sixth Embodiment

A sixth embodiment will be described below. Differences from the embodiment will be mainly described. In the present embodiment, a calibration (correction matrix generation process) is executed outside an SEM image acquisition period. Accordingly, it is possible to appropriately make a corresponding correction for a change in each signal electron beam during generation of an SEM image, and to generate a more accurate SEM image.

FIG. 15 illustrates an example of a relation between an imaging period and a calibration period for the SEM image During generation of one SEM image, the control terminal 112 controls the scanning deflector 106 to sequentially image scanning lines on the sample 200. In FIG. 15, a graph illustrates a temporal change of a control signal (scanning signal) toward the scanning deflector 106, for example, a temporal change of a voltage signal for scanning toward an X direction.

In the example in FIG. 15, an SEM imaging period 501 is a period in which one scanning line is imaged. The control terminal 112 generates an image of a corresponding scanning line based on an intensity distribution of the signal electron beam detected in each of the SEM imaging periods 501. The control terminal 112 executes the calibration in a period 503 between the consecutive SEM imaging periods 501. The control terminal 112 executes, for example, the calibration described in the first embodiment during the period 503. By executing the calibration during the period in which the scanning line is changed, the correction matrix can be acquired without influencing an imaging time.

In one example, the control terminal 112 executes the calibration before each of the SEM imaging periods 501 or during each of the periods 503. In another example, the calibration is executed before each of some of the SEM imaging periods 501 selected from all of the SEM imaging periods 501, or during some of the periods 503. A calibration frequency is determined according to a design of the SEM. The SEM imaging period may not coincide with an imaging period of one scanning line. In one period 503, only a part of the plurality of signal electron beams, for example, one signal electron beam may be calibrated.

The invention not limited to the embodiment described above and includes various modifications. For example, the embodiments described above are described in detail for easy understanding of the invention, and the invention is not necessarily limited to those including all the configurations described above. A part of a configuration of one embodiment can be replaced with a configuration of another embodiment, and the configuration of another embodiment can be added to the configuration of one embodiment. A part of the configuration of each embodiment may be added to, deleted from, or replaced with another configuration.

Each of the configurations, functions, processing units, or the like described above may be partially or entirely implemented by hardware, for example, by designing using an integrated circuit. The above configurations, functions, and the like may also be implemented by a software by interpreting and executing a program that implements the functions using a processor. Information of programs, tables, files or the like for implementing each function can be placed in a recording device such as a memory, a hard disk, and a solid state drive (SSD), or a recording medium such as an IC card, an SD card, or the like. Further, control lines and information lines show those considered to be necessary for the description, and not all the control lines and the information lines are necessarily shown on the product. In practice, it may be considered that almost all the configurations are connected to each other.

The invention claimed is:

1. A charged particle beam device, comprising:
a plurality of detectors configured to detect one or more signal charged particle beams caused by irradiation on a sample with one or more primary charged particle beams; and
a control system, wherein
the control system is configured to
measure an intensity distribution of the one or more signal charged particle beams detected by the plurality of detectors,
correct the intensity distribution by using a correction function, and
generate an image based on the corrected intensity distribution.

2. The charged particle beam device according to claim 1, wherein
the one or more primary charged particle beams include a plurality of primary charged particle beams.

3. The charged particle beam device according to claim 1, wherein
the control system is further configured to perform a generation process of the correction function, and
the generation process includes
sequentially selecting different parts of primary charged particle beams of the one or more primary charged particle beams and irradiating the sample or a sample different from the sample with the selected different primary charged particle beams,
measuring an intensity distribution of one or more signal charged particle beams which are caused by each of the different parts of primary charged particle beams detected by the plurality of detectors and separated by the plurality of detectors, and
generating the correction function based on the intensity distribution of each of the different primary charged particle beams.

4. The charged particle beam device according to claim 3, wherein
the one or more primary charged particle beams include a plurality of primary charged particle beams, and
the different parts include a single primary charged particle beam.

5. The charged particle beam device according to claim 1, wherein
the control system is configured to
store a plurality of correction functions corresponding to different irradiation positions of the one or more primary charged particle beams, and
correct, based on the plurality of correction functions, intensity distributions of a plurality of signal electron beams which are caused by irradiating the different irradiation positions with the one or more primary charged particle beams and detected by the plurality of detectors.

6. The charged particle beam device according to claim 5, wherein
the control system is configured to make a correction for each pixel of the image based on one correction function selected from the plurality of correction functions.

7. The charged particle beam device according to claim 2, wherein
the number of the plurality of detectors is more than the number of the plurality of primary charged particle beams.

8. The charged particle beam device according to claim 1, wherein
the one or more primary charged particle beams include a plurality of primary charged particle beams,
the one or more signal charged particle beams include a plurality of signal charged particle beams,
the control system is configured to measure, by using a calibration sample corresponding to each of the plurality of primary charged particle beams, the intensity distribution of the signal charged particle beam caused by each of the plurality of primary charged particle beams in the plurality of detectors, in each of the calibration samples, an emission rate of a corresponding primary charged particle beam is higher than an emission rate of the other primary charged particle beam, and the control system is configured to generate the correction function based on the intensity distribution of each of the plurality of signal charged particle beams.

9. The charged particle beam device according to claim 3, wherein the control system is configured to generate a part of the image of the sample in each of a plurality of consecutive imaging periods, and execute the generation process of the correction function before each of some or all of the plurality of consecutive imaging periods.

10. A method for generating an image by a control system of a charged particle beam device including a plurality of detectors configured to detect one or more signal charged particle beams caused by irradiation on a sample with one or more primary charged particle beams, the method comprising:

measuring an intensity distribution of the one or more signal charged particle beams detected by the plurality of detectors;

correcting the intensity distribution by using a correction function; and generating an image based on the corrected intensity distribution.

* * * * *